(12) United States Patent
Alhussien et al.

(10) Patent No.: US 9,298,547 B2
(45) Date of Patent: Mar. 29, 2016

(54) DETECTION/ERASURE OF RANDOM WRITE ERRORS USING CONVERGED HARD DECISIONS

(71) Applicant: LSI Corporation, San Jose, CA (US)

(72) Inventors: Abdel-Hakim S. Alhussien, San Jose, CA (US); Erich F. Haratsch, Bethlehem, PA (US); Yunxiang Wu, Cupertino, CA (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 14/150,810

(22) Filed: Jan. 9, 2014

(65) Prior Publication Data

US 2015/0135032 A1 May 14, 2015

Related U.S. Application Data

(60) Provisional application No. 61/902,450, filed on Nov. 11, 2013.

(51) Int. Cl.
| | |
|---|---|
| *G06F 11/10* | (2006.01) |
| *G11C 29/52* | (2006.01) |
| *G11C 29/42* | (2006.01) |
| *G11C 29/56* | (2006.01) |
| *G11C 29/04* | (2006.01) |
| *H03M 13/37* | (2006.01) |
| *H03M 13/11* | (2006.01) |
| *H03M 13/45* | (2006.01) |
| *G11C 29/50* | (2006.01) |
| *G11C 11/56* | (2006.01) |

(52) U.S. Cl.
CPC ........ *G06F 11/1072* (2013.01); *G06F 11/1012* (2013.01); *G11C 29/42* (2013.01); *G11C 29/52* (2013.01); *H03M 13/1105* (2013.01); *H03M 13/1142* (2013.01); *H03M 13/373* (2013.01); *H03M 13/3723* (2013.01); *H03M 13/3769* (2013.01); *H03M 13/451* (2013.01); *G11C 11/56* (2013.01); *G11C 2029/0409* (2013.01); *G11C 2029/0411* (2013.01); *G11C 2029/5004* (2013.01)

(58) Field of Classification Search
CPC .... G11C 11/5642; G11C 16/26; G11C 29/00; G11C 16/3454; H03M 13/1111; H03M 13/3707; H03M 13/451; H03M 13/458; H03M 13/3746
USPC .......................................... 714/763, 780, 794
See application file for complete search history.

(56) References Cited

U.S. PATENT DOCUMENTS

| | | | | |
|---|---|---|---|---|
| 7,656,707 | B2* | 2/2010 | Kozlov | .................... 365/185.05 |
| 8,385,117 | B2* | 2/2013 | Sakurada et al. | ........ 365/185.03 |
| 2012/0072805 | A1* | 3/2012 | Tseng et al. | ................... 714/773 |
| 2012/0213001 | A1* | 8/2012 | Yang | ........................... 365/185.2 |
| 2012/0224420 | A1* | 9/2012 | Sakurada et al. | ........ 365/185.03 |
| 2013/0145235 | A1 | 6/2013 | Alhussien et al. | |
| 2014/0237318 | A1* | 8/2014 | Fitzpatrick et al. | ........... 714/763 |
| 2014/0281767 | A1* | 9/2014 | Alhussien et al. | ............. 714/721 |
| 2015/0113353 | A1* | 4/2015 | Tseng | .......................... 714/763 |

\* cited by examiner

*Primary Examiner* — James C Kerveros
(74) *Attorney, Agent, or Firm* — Suiter Swantz pc llo

(57) ABSTRACT

A low-density parity-check decoder in a system with multi-level cells identifies zones of reliability where write errors or stuck cells are identifiable. The system uses assumedly successfully decoded pages associated with bits in a cell to identify candidate write errors or stuck cells and erases a corresponding log-likelihood ratio even where such log-likelihood ratio is saturated, thereby breaking a potential trapping set without post-processing.

20 Claims, 11 Drawing Sheets

DETECTION/ERASURE OF RANDOM WRITE ERRORS USING CONVERGED HARD DECISIONS

PRIORITY

The present application claims the benefit under 35 U.S.C. §119(e) of U.S. Provisional Application Ser. No. 61/902,450, filed Nov. 11, 2013, which is incorporated herein by reference.

FIELD OF THE INVENTION

The present invention is directed generally toward multi-level cell memory, and more particularly toward low-density parity-check decoding in a multi-level cell memory.

BACKGROUND OF THE INVENTION

Low-density parity-check codes are used in numerous data storage and signals applications. During decoding, posteriori log-likelihood ratios, extrinsic log-likelihood ratios and syndrome vectors are often not stored after convergence or failure in order to increase decoder throughput. In that case, the applicability of post processing is limited. In multi-level cell memories, at least one of the most significant bit or least significant bit pages converges to a codeword most of the time, usually the least significant bit page in random noise dominated memories. On the other hand, in write error dominated memories the most significant bit pages converge more often.

Consequently, it would be advantageous if an apparatus existed that is suitable for using successfully decoded codewords and corresponding data to identify and correct write errors using this asymmetry in decoding success among pages on the same wordline.

SUMMARY OF THE INVENTION

Accordingly, the present invention is directed to a novel method and apparatus for using successfully decoded codewords and corresponding data to identify and correct write errors.

In at least one embodiment of the present invention, where a multi-level cell in a low-density parity check code system contains a non-converging bit, the system identifies zones of reliability where write errors or stuck cells are identifiable. The system then uses a successfully decoded page associated with one of the bits in the cell to identify candidate write errors or stuck cells and erases a corresponding log-likelihood ratio.

In another embodiment of the present invention, where a multi-level cell in a low-density parity check code system contains a non-converging bit, the system assumes correct decoding of one page associated with one of the bits in the cell. The system then identifies candidate write errors or stuck cells based on the assumed correct page and buffered hard decision data. No post-processing is utilized.

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the subject matter disclosed, which is illustrated in the accompanying drawings. The scope of the invention is limited only by the claims; numerous alternatives, modifications and equivalents are encompassed. For the purpose of clarity, technical material that is known in the technical fields related to the embodiments has not been described in detail to avoid unnecessarily obscuring the description.

Figure 1:
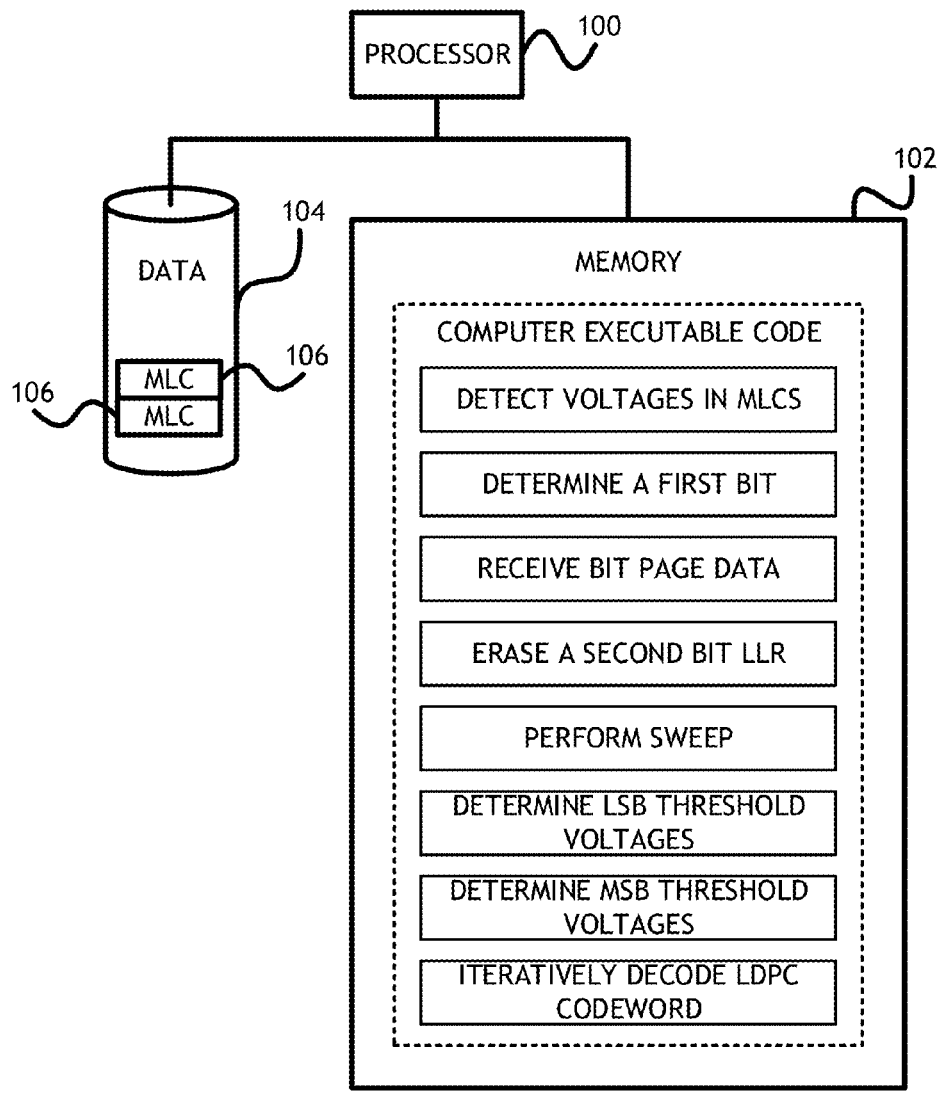
FIG. 1 shows a block diagram of a computer apparatus useful for implementing embodiments of the present invention.

Referring to FIG. 1, a block diagram of a computer apparatus useful for implementing embodiments of the present invention is shown. The apparatus includes a processor 100, memory 102 connected to the processor 100 and a data store 104 connected to the processor 100. In at least one embodiment, the data store 104 comprises one or more multi-level memory cells 106.

The processor 100 is configured to execute computer executable program code to correct one or more write errors in a low-density parity-check code embodied in the data store 104.

Figure 2:
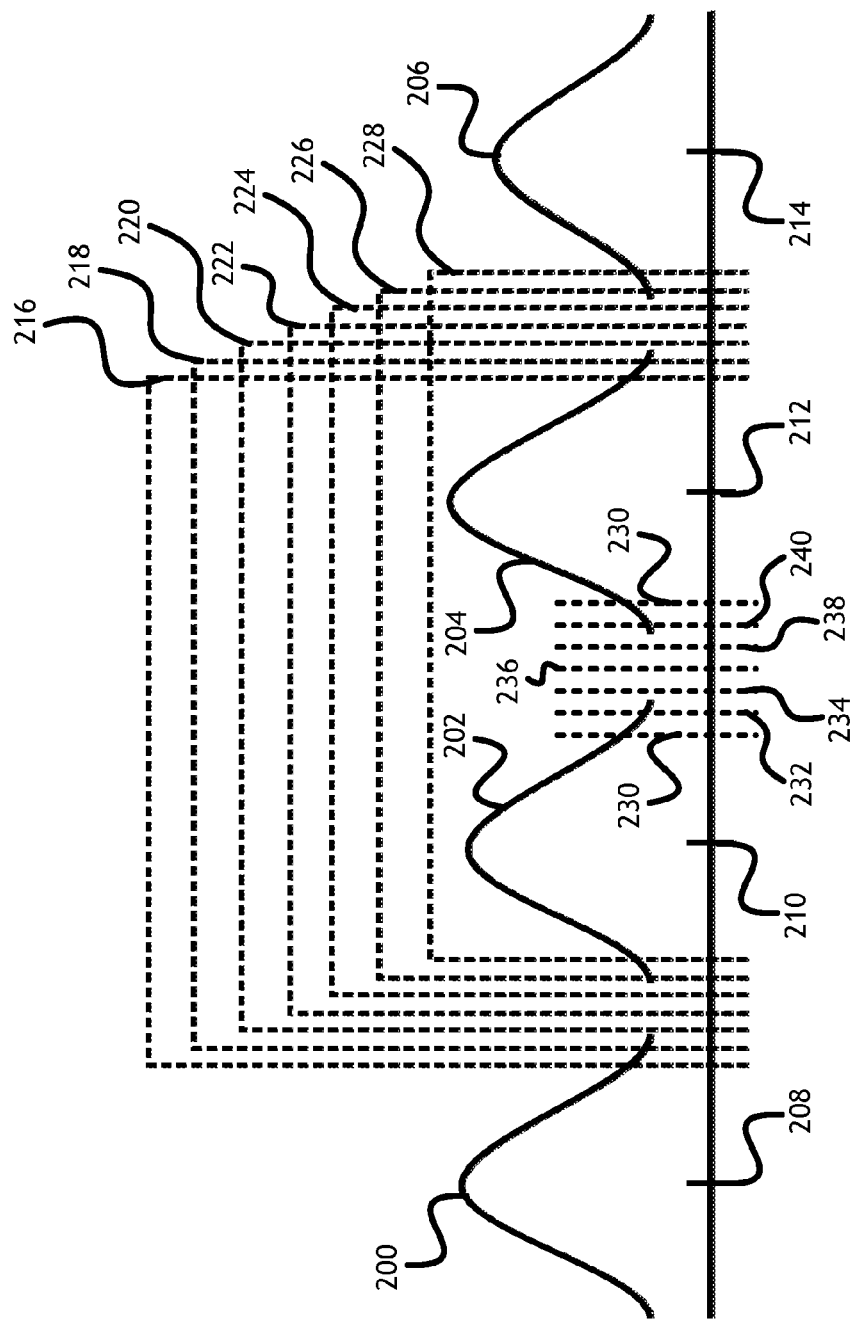
FIG. 2 shows a diagram representation of memory cell voltages and multiple upper and lower page reads.

Referring to FIG. 2, a diagram representation of memory cell voltages is shown. A multi-level cell may have four possible voltage states: a first state 208 represented by the bits 11; a second state 210 represented by the bits 01; a third state 212 represented by the bits 00 and a fourth state 214 represented by the bits 10. In each of the four memory states 208, 210, 212, 214, the most significant bit is represented by the left-most bit while the least significant bit is represented by the rightmost bit. Although a four-state memory cell is disclosed, a person of ordinary skill in the art would appreciate that the principles are applicable to any number of voltage levels larger than two. Also, the methodology can be extended by anyone skilled in the art to other mappings of voltage states to multi-bit data patterns.

Each state 208, 210, 212, 214 represents the target threshold voltage to be programmed to the multi-level cell. However, due to read noises, charge loss, and imprecise programming the voltage on the cell can be read as any value from a probability distribution 200, 202, 204, 206 of voltages. For example, the first target state 208 can be read as any voltage within a first state distribution 200; the second target state 210 can be read as any voltage within a second state distribution 202; the third target state 212 can be read as any voltage within a third state distribution 204 and the fourth target state 214 can be read as any voltage with a fourth state distribution 206

Multi-read patterns associated with the most significant bit for a cell are determined based on a plurality of voltage measurements 216, 218, 220, 222, 224, 226, 228 corresponding to transition zones for the most significant bit in the memory cell; that is, the voltage where the memory cell transitions from the first state distribution 200 to the second state distribution 202, and where the memory cell transitions from the third state distribution 204 to the fourth state distribution 206, and vice versa. Likewise, similar Multi-read patterns associated with the least significant bit for a cell are determined based on similar least significant bit voltage measurements 230, 232, 234, 236, 238, 240 corresponding to the transition from the second state distribution 202 to the third state distribution 204. Multi-read patterns are combined to estimate threshold voltages programmed to the cell between states 208, 210, 212, and 214. Threshold voltages less than the lowest voltage measurement 216 and greater than the highest voltage measurement 228 are considered reliable. Moreover, the most significant bit reads can occur in any order and still be utilized by the methods discussed herein to estimate the threshold voltage in a finite bit representation. The read order illustrated in FIG. 2 is only exemplary, not limiting.

In low-density parity-check code decoding systems, converged hard decisions are used to determine possible erroneous bits based on unsatisfied check nodes and unravel the trapping set they contribute to in the non-converged hard decisions. In at least one embodiment, converged hard decisions are buffered. Where converged hard decisions are buffered for one page, a discrepancy between multi-read patterns of the non-converged page and hard decisions of the converged page is used to detect write errors or stuck cells in the non-converged page.

Figure 3:
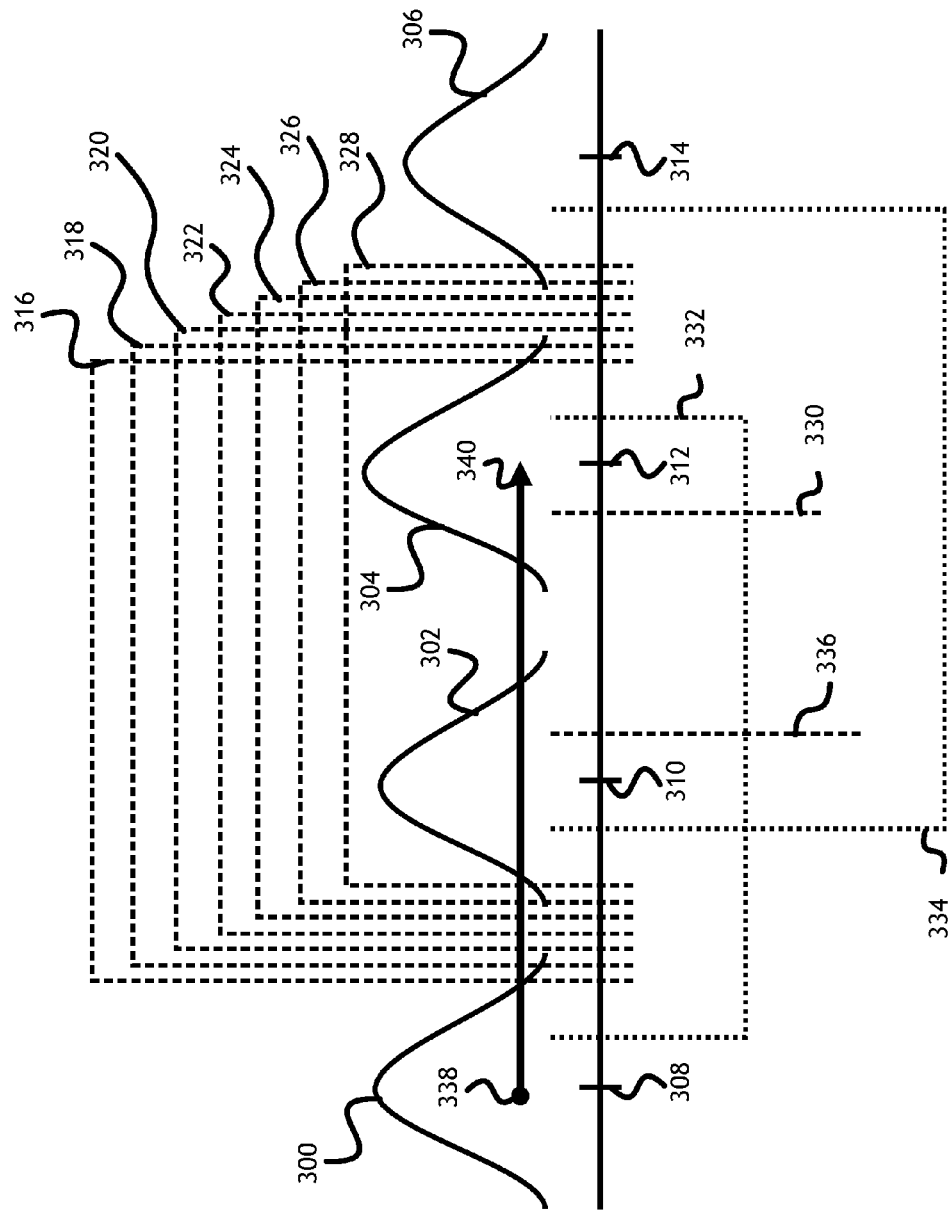
FIG. 3 shows a diagram representation of memory cell voltages appurtenant to a write error during voltage tests according to at least one embodiment of the present invention.

Referring to FIG. 3, a diagram representation of memory cell voltages appurtenant to a write error during voltage multi-read according to at least one embodiment of the present invention is shown. In at least one embodiment, a write error causes erroneous bits 00 340 to be read by the processor instead of the intended bits 11 338. In a multi-level cell having four possible states (a first state 308 represented by the bits 11; a second state 310 represented by the bits 01; a third state 312 represented by the bits 00 and a fourth state 314 represented by the bits 10) the decoded low-density parity-check bits are mapped to one of the memory states 308, 310, 312, and 314. Each state 308, 310, 312, 314 is defined by a voltage distribution 300, 302, 304, 306 of possible voltages.

The extra least significant bit reads 336, 330 and extra most significant bit reads 332, 334 define reliable zones which can reliably detect stuck cells (defects) type errors. If the cell voltage of a cell is determined to be in a reliable zone using a multi-read and that was inconsistent with the converged low density parity-check decisions, then a write error will be detected. The reliable zones are defined in the following way, the region below the lower voltage side of read 332 is defined as the reliable zone for state 308, the region above the upper voltage side of read 334 is defined as the reliable zone for state 314, the region above the lower voltage side of 334 and below 336 is defined as the reliable zone for state 310, and the region below the upper voltage side of 332 and above 330 is defined as the reliable zone for state 312. For example, assume that state 308 (corresponding to 11) is the target threshold voltage to be programmed to the cell, but due to a write error the target cell voltage 312 (corresponding to 00) is programmed instead. Now if the noise is not too high, which is typical of the signal-to-noise region of interest where a low density parity-check error floor event can occur, then the cell voltage will be in the reliable zone bounded by the least significant bit read 330 and the upper side of the most significant bit read 332. Now suppose the low density parity-check decoder converges for the most significant bit page indicating that the correct most significant bit is actually 1, this would be inconsistent with the cell voltage being in the above reliable zone, as the above reliable zone corresponds to a most significant bit of 0. In the other scenario, suppose the low density parity-check decoder converges for the least significant bit page indicating that the least significant bit is actually 1, this would be inconsistent with the cell voltage being in the above reliable zone, as the above reliable zone corresponds to a least significant bit of 0. Given this inconsistency, when the low density parity-check decoder converged for the either the most significant bit or least significant bit page and indicated an error for the most significant bit or least significant bit in question, it is also likely, but not definite, that the in-cell least significant bit or most significant bit, respectively, has undergone a write error.

Once the aforementioned discrepancy in the least significant bit/most significant bit is detected and a write error is declared in the corresponding in-cell most significant bit/least significant bit. The log-likelihood ratio corresponding to that most significant bit/least significant bit is erased and the affected most significant bit/least significant bit page is re-decoded.

Multi-read patterns associated with the most significant bit for a cell are determined based on a plurality of voltage measurements 316, 318, 320, 322, 324, 326, 328 corresponding to transition zones for the most significant bit in the memory cell. Multi-read patterns are combined to estimate threshold voltages between states 308, 310, 312, 314.

During decoding, where a decoder identifies an error in a decoded word written to a multi-level cell, the decoder determines voltage thresholds based on combined least significant bit and most significant bit Multi-read patterns. In this case assuming either the least significant page or the most significant page decoded correctly would produce a discrepancy.

Where the decoder has reached a specified number of attempts to decode the most significant page without convergence, the decoder utilizes the successfully decoded least significant page to identify potential write errors or stuck cells. The decoder erases a log-likelihood ratio associated with the most significant bits exhibiting a discrepancy with the Multi-read patterns and attempts to re-decode the most significant page.

Where the decoder has reached a specified number of attempts to decode the least significant page without convergence, the decoder utilizes the successfully decoded most significant page to identify potential write errors or stuck cells. The decoder erases a log-likelihood ratio associated with the least significant bits exhibiting a discrepancy with the Multi-read patterns and attempts to re-decode the least significant page.

Figure 4:
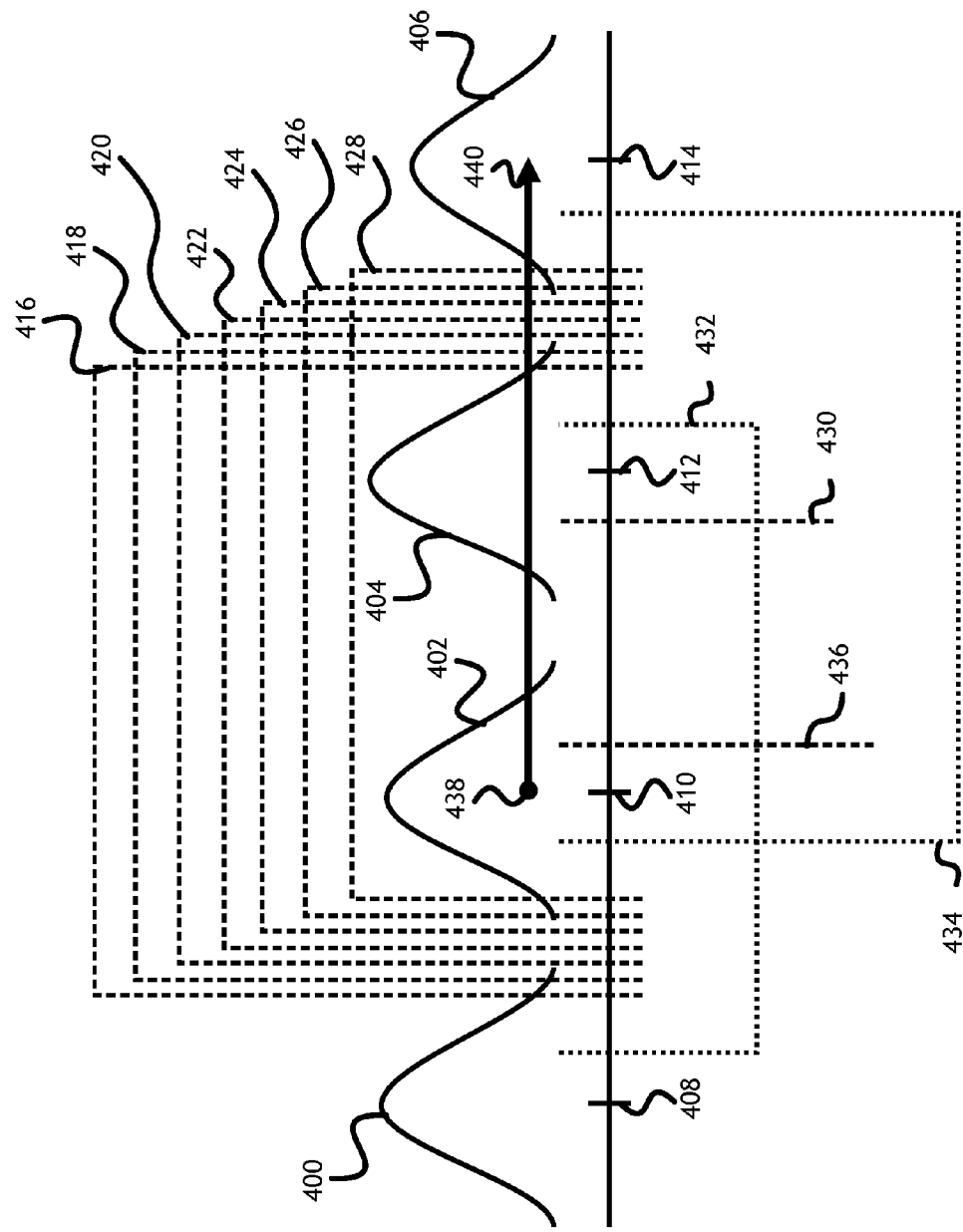
FIG. 4 shows a diagram representation of memory cell voltages appurtenant to a write error during voltage tests according to at least one embodiment of the present invention.

Referring to FIG. 4, a diagram representation of memory cell voltages appurtenant to a write error during voltage multi-read according to at least one embodiment of the present invention is shown. In at least one embodiment, a write error causes erroneous bits 10 440 to be read by the processor instead of the intended bits 01 438. The extra least significant bit reads 436, 430 and extra most significant bit reads 432, 434 define reliable zones which can reliably detect stuck cell (defects) type errors. If the cell voltage of a cell is determined to be in a reliable zone using a multi-read and that was inconsistent with the converged low density parity-check decisions, then a write error will be detected. The reliable zones are defined in the following way, the region below the lower voltage side of read 432 is defined as the reliable zone for state 408, the region above the upper voltage side of read 434 is defined as the reliable zone for state 414, the region above the lower voltage side of 434 and below 436 is defined as the reliable zone for state 410, and the region below the upper voltage side of 432 and above 430 is defined as the reliable zone for state 412. For example, assume that state 440 (corresponding to 10) is the target threshold voltage to be programmed to the cell, but due to a write error the target cell voltage 438 (corresponding to 01) is programmed instead. Now if the noise is not too high, which is typical of the signal-to-noise region of interest where a low density parity-check error floor event can occur, then the cell voltage will be in the reliable zone bounded by the upper side of the most significant bit read 434. Now suppose the low density parity-check decoder converges for the most significant bit page indicating that the correct most significant bit is actually 0, this would be inconsistent with the cell voltage being in the above reliable zone, as the above reliable zone corresponds to a most significant bit of 1. In the other scenario, suppose the low density parity-check decoder converges for the least significant bit page indicating that the least significant bit is actually 0, this would be inconsistent with the cell voltage being in the above reliable zone, as the above reliable zone corresponds to a least significant bit of 1. Given this inconsistency, when the low density parity-check decoder converged for the either the most significant bit or least significant bit page and indicated an error for the most significant bit or least significant bit in question, it is also likely, but not definite, that the in-cell least significant bit or most significant bit, respectively, has undergone a write error.

Once the aforementioned discrepancy in the least significant bit/most significant bit is detected and a write error is declared in the corresponding in-cell most significant bit/least significant bit. The log-likelihood ratio corresponding to that most significant bit/least significant bit is erased and the affected most significant bit/least significant bit page is re-decoded once all log-likelihood ratios are erased for each detected discrepancy.

Multi-read patterns associated with the most significant bit for a cell are determined based on a plurality of voltage measurements 416, 418, 420, 422, 424, 426, 428 corresponding to transition zones for the most significant bit in the memory cell. Multi-read patterns are combined to estimate threshold voltages between states 408, 410, 412, 14.

During decoding, where a decoder identifies an error in a decoded word written to a multi-level cell, the decoder determines voltage thresholds based on combined least significant bit and most significant bit Multi-read patterns. In this case assuming either the least significant page or the most significant page decoded correctly would produce a discrepancy.

Where the decoder has reached a specified number of attempts to decode the most significant page without convergence, the decoder utilizes the successfully decoded least significant page to identify potential write errors or stuck cells. The decoder erases a log-likelihood ratio associated with the most significant bits exhibiting a discrepancy with the Multi-read patterns and attempts to re-decode the most significant page.

Where the decoder has reached a specified number of attempts to decode the least significant page without convergence, the decoder utilizes the successfully decoded most significant page to identify potential write errors or stuck cells. The decoder erases a log-likelihood ratio associated with the least significant bits exhibiting a discrepancy with the Multi-read patterns and attempts to re-decode the least significant page.

Figure 5:
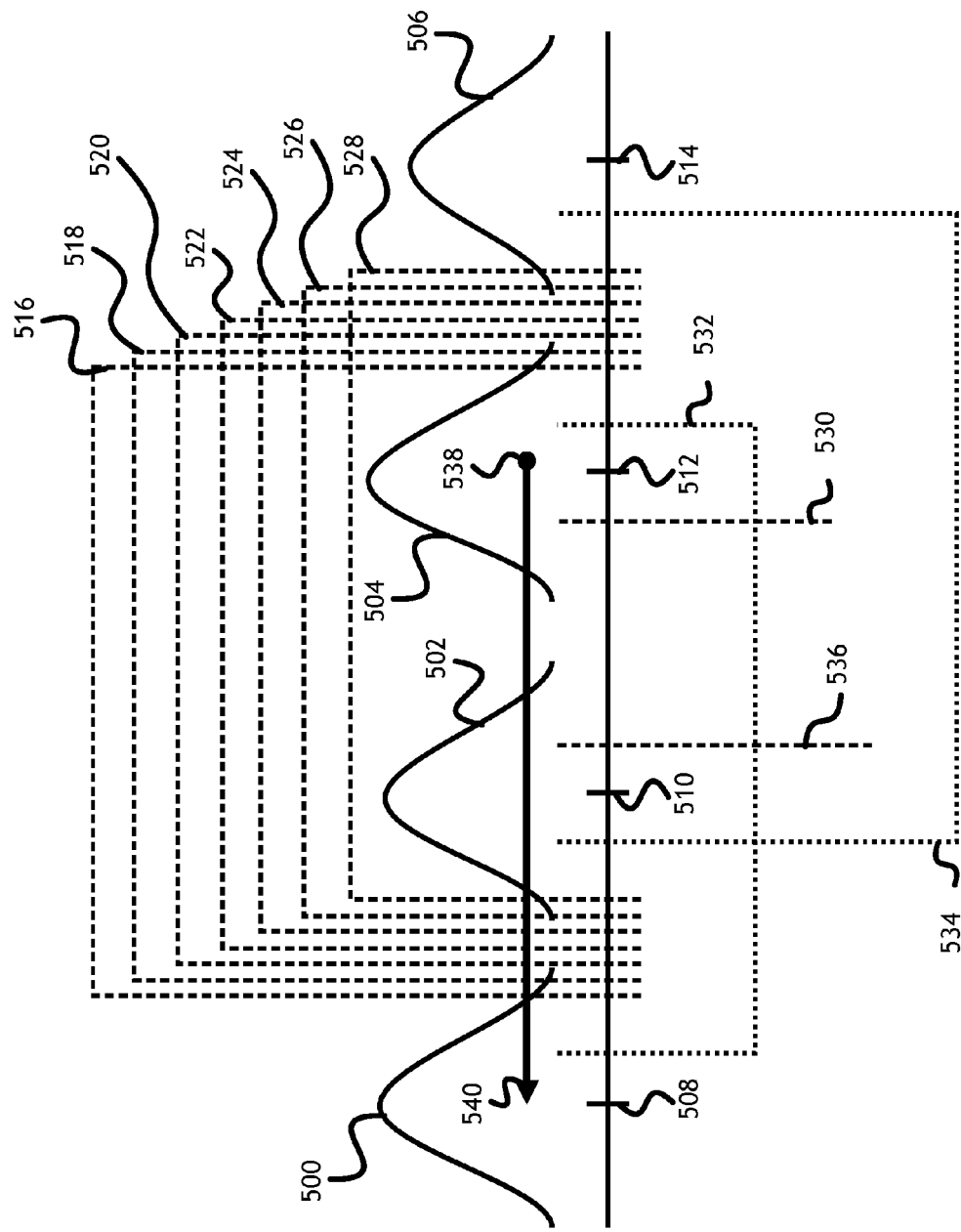
FIG. 5 shows a diagram representation of memory cell voltages appurtenant to a write error during voltage tests according to at least one embodiment of the present invention.

Referring to FIG. 5, a diagram representation of memory cell voltages appurtenant to a write error during voltage multi-read according to at least one embodiment of the present invention is shown. In at least one embodiment, a write error causes erroneous bits 11 540 to be read by the processor instead of the intended bits 00 538. The extra least significant bit reads 536, 530 and extra most significant bit reads 532, 534 define reliable zones which can reliably detect stuck cells (defects) type errors. If the cell voltage of a cell is determined to be in a reliable zone using a multi-read and that was inconsistent with the converged low density parity-check decisions, then a write error will be detected. The reliable zones are defined in the following way, the region below the lower voltage side of read 532 is defined as the reliable zone for state 508, the region above the upper voltage side of read 534 is defined as the reliable zone for state 514, the region above the lower voltage side of 534 and below 536 is defined as the reliable zone for state 510, and the region below the upper voltage side of 532 and above 530 is defined as the reliable zone for state 512. For example, assume that state 512 (corresponding to 00) is the target threshold voltage to be programmed to the cell, but due to a write error the target cell voltage 508 (corresponding to 11) is programmed instead. Now if the noise is not too high, which is typical of the signal-to-noise region of interest where a low density parity-check error floor event can occur, then the cell voltage will be in the reliable zone bounded by the lower side of the most significant bit read 532. Now suppose the low density parity-check decoder converges for the most significant bit page indicating that the correct most significant bit is actually 0, this would be inconsistent with the cell voltage being in the above reliable zone, as the above reliable zone corresponds to a most significant bit of 1. In the other scenario, suppose the low density parity-check decoder converges for the least significant bit page indicating that the least significant bit is actually 0, this would be inconsistent with the cell voltage being in the above reliable zone, as the above reliable zone corresponds to a least significant bit of 1. Given this inconsistency, when the low density parity-check decoder converged for the either the most significant bit or least significant bit page and indicated an error for the most significant bit or least significant bit in question, it is also likely, but not definite, that the in-cell least significant bit or most significant bit, respectively, has undergone a write error.

Once the aforementioned discrepancy in the least significant bit/most significant bit is detected and a write error is declared in the corresponding in-cell most significant bit/least significant bit. The log-likelihood ratio corresponding to that most significant bit/least significant bit is erased and the affected most significant bit/least significant bit page is re-decoded once all log-likelihood ratios are erased for each detected discrepancy.

Multi-read patterns associated with the most significant bit for a cell are determined based on a plurality of voltage measurements 516, 518, 520, 522, 524, 526, 528 corresponding to transition zones for the most significant bit in the memory cell. Multi-read patterns are combined to estimate threshold voltages between states 508, 510, 512, 514.

During decoding, where a decoder identifies an error in a decoded word written to a multi-level cell, the decoder determines voltage thresholds based on combined least significant bit and most significant bit Multi-read patterns. In this case assuming either the least significant page or the most significant page decoded correctly would produce a discrepancy.

Where the decoder has reached a specified number of attempts to decode the most significant page without convergence, the decoder utilizes the successfully decoded least significant page to identify potential write errors or stuck cells. The decoder erases a log-likelihood ratio associated with the most significant bits exhibiting a discrepancy with the Multi-read patterns and attempts to re-decode the most significant page.

Where the decoder has reached a specified number of attempts to decode the least significant page without convergence, the decoder utilizes the successfully decoded most significant page to identify potential write errors or stuck cells. The decoder erases a log-likelihood ratio associated with the least significant bits exhibiting a discrepancy with the Multi-read patterns and attempts to re-decode the least significant page.

Figure 6:
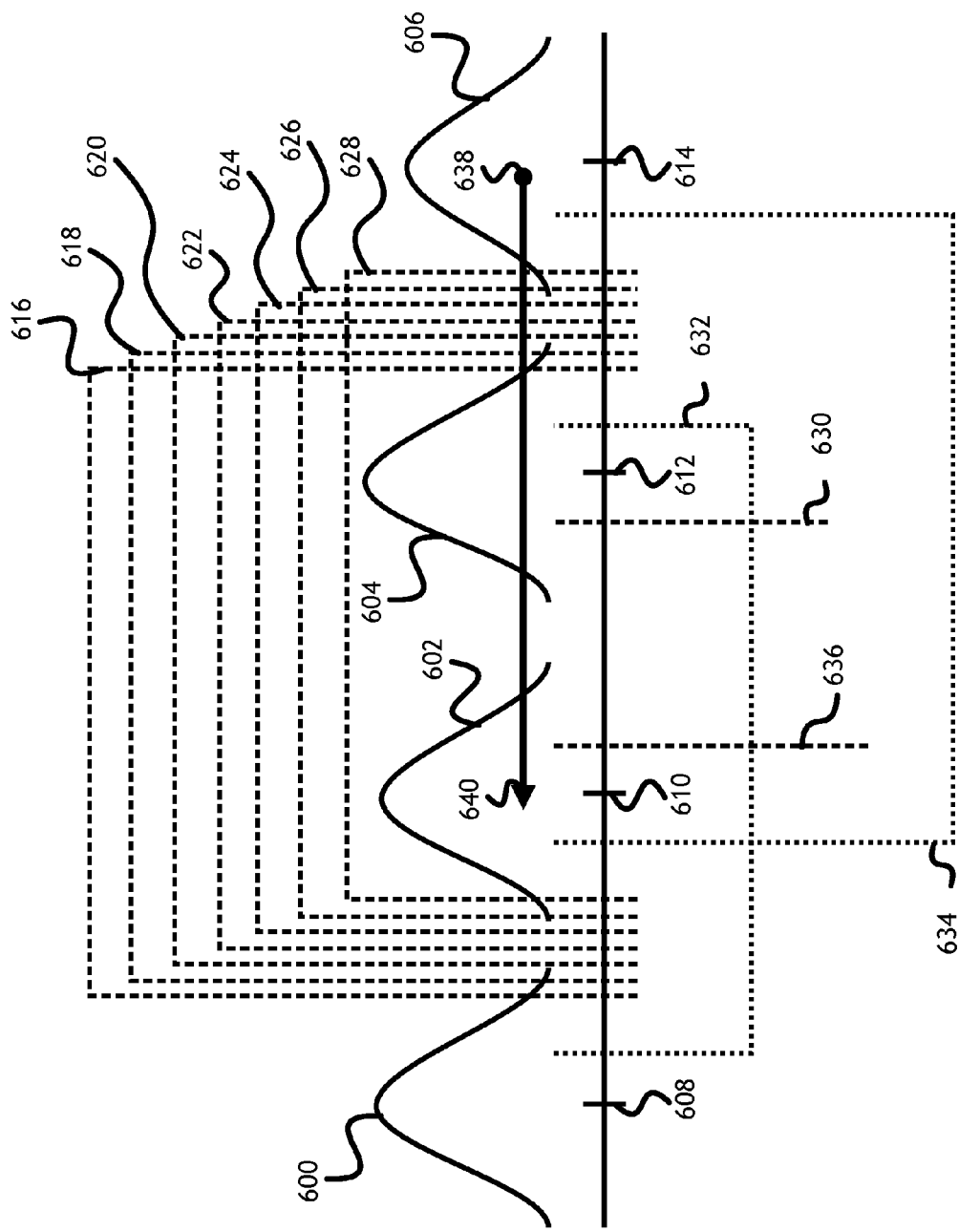
FIG. 6 shows a diagram representation of memory cell voltages appurtenant to a write error during voltage tests according to at least one embodiment of the present invention.

Referring to FIG. 6, a diagram representation of memory cell voltages appurtenant to a write error during voltage multi-read according to at least one embodiment of the present invention is shown. In at least one embodiment, a write error causes erroneous bits 01 640 to be read by the processor instead of the intended bits 10 638. The extra least significant bit reads 636, 630 and extra most significant bit reads 632, 634 define reliable zones which can reliably detect stuck cells (defects) type errors. If the cell voltage of a cell is determined to be in a reliable zone using a multi-read and that was inconsistent with the converged low density parity-check decisions, then a write error will be detected. The reliable zones are defined in the following way, the region below the lower voltage side of read 632 is defined as the reliable zone for state 608, the region above the upper voltage side of read 634 is defined as the reliable zone for state 614, the region above the lower voltage side of 634 and below 636 is defined as the reliable zone for state 610, and the region below the upper voltage side of 632 and above 630 is defined as the reliable zone for state 612. For example, assume that state 638 (corresponding to 10) is the target threshold voltage to be programmed to the cell, but due to a write error the target cell voltage 640 (corresponding to 01) is programmed instead. Now if the noise is not too high, which is typical of the signal-to-noise region of interest where a low density parity-check error floor event can occur, then the cell voltage will be in the reliable zone bounded by the lower side of the least significant bit read 636 and the upper side of the most significant bit read 634. Now suppose the low density parity-check decoder converges for the most significant bit page indicating that the correct most significant bit is actually 1, this would be inconsistent with the cell voltage being in the above reliable zone, as the above reliable zone corresponds to a most significant bit of 0. In the other scenario, suppose the low density parity-check decoder converges for the least significant bit page indicating that the least significant bit is actually 1, this would be inconsistent with the cell voltage being in the above reliable zone, as the above reliable zone corresponds to a least significant bit of 0. Given this inconsistency, when the low density parity-check decoder converged for the either the most significant bit or least significant bit page and indicated an error for the most significant bit or least significant bit in question, it is also likely, but not definite, that the in-cell least significant bit or most significant bit, respectively, has undergone a write error.

Once the aforementioned discrepancy in the least significant bit/most significant bit is detected and a write error is declared in the corresponding in-cell most significant bit/least significant bit. The log-likelihood ratio corresponding to that most significant bit/least significant bit is erased and the affected most significant bit/least significant bit page is re-decoded once all log-likelihood ratios are erased for each detected discrepancy.

Multi-read patterns associated with the most significant bit for a cell are determined based on a plurality of voltage measurements 616, 618, 620, 622, 624, 626, 628 corresponding to transition zones for the most significant bit in the memory cell. Multi-read patterns are combined to estimate threshold voltages between states 608, 610, 612, 614.

During decoding, where a decoder identifies an error in a decoded word written to a multi-level cell, the decoder determines voltage thresholds based on combined least significant bit and most significant bit Multi-read patterns. In this case assuming either the least significant page or the most significant page decoded correctly would produce a discrepancy.

Where the decoder has reached a specified number of attempts to decode the most significant page without convergence, the decoder utilizes the successfully decoded least significant page to identify potential write errors or stuck cells. The decoder erases a log-likelihood ratio associated with the most significant bits exhibiting a discrepancy with the Multi-read patterns and attempts to re-decode the most significant page.

Where the decoder has reached a specified number of attempts to decode the least significant page without convergence, the decoder utilizes the successfully decoded most significant page to identify potential write errors or stuck cells. The decoder erases a log-likelihood ratio associated with the least significant bits exhibiting a discrepancy with the Multi-read patterns and attempts to re-decode the least significant page.

A person skilled in the art may appreciate that other error states besides the ones described herein are possible. Such errors could be caused by threshold voltages encroaching from one state to another such that voltage measurements are less effective at simulating such thresholds.

Figure 7:
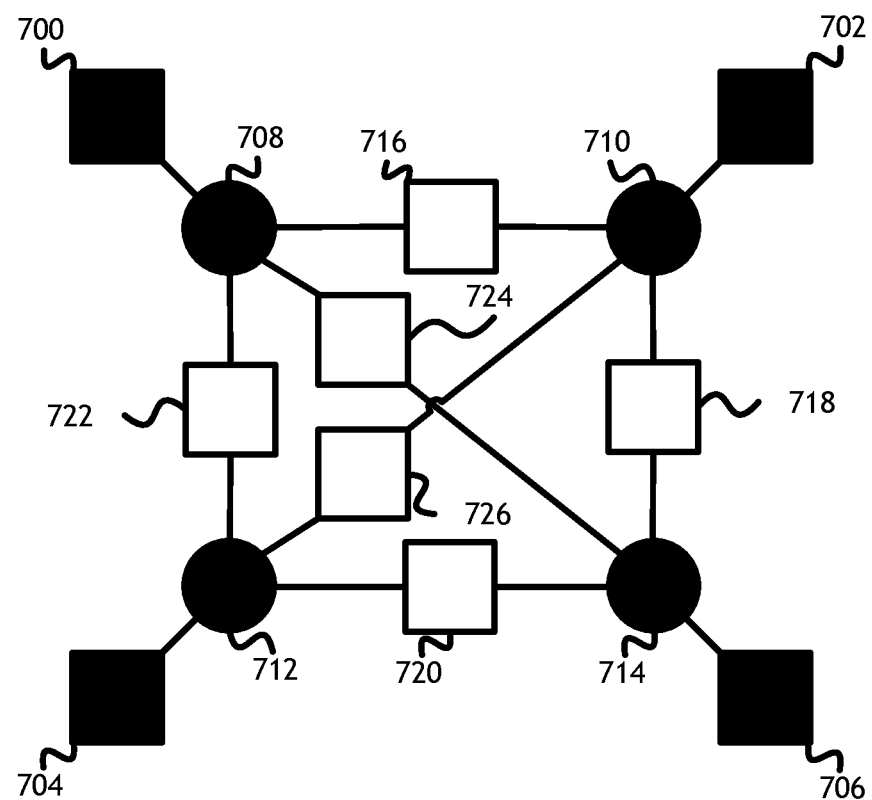
FIG. 7 shows a diagram of an exemplary trapping set.

Referring to FIG. 7, a diagram of a trapping set is shown. A four by four trapping set can occur due to cell defects causing all four bit nodes to appear to be error bit nodes 708, 710, 712, 714. All of the bit node interconnected check nodes are satisfied check nodes 716, 718, 720, 722 while all of the single bit node check nodes are unsatisfied check nodes 700, 702, 704, 706. Where one of the error bit nodes 708, 710, 712, 714 is the result of a write error or stuck cell, the error bit nodes could all have effectively saturated log-likelihood ratios. For example, a first error bit node 708 has a log-likelihood ratio of $-16$; a second error bit node 710 has a log-likelihood ratio of −16; a third error bit node 712 has a log-likelihood ratio of −16 and a fourth error bit node 714 has a log-likelihood ratio of −9.

Figure 8:
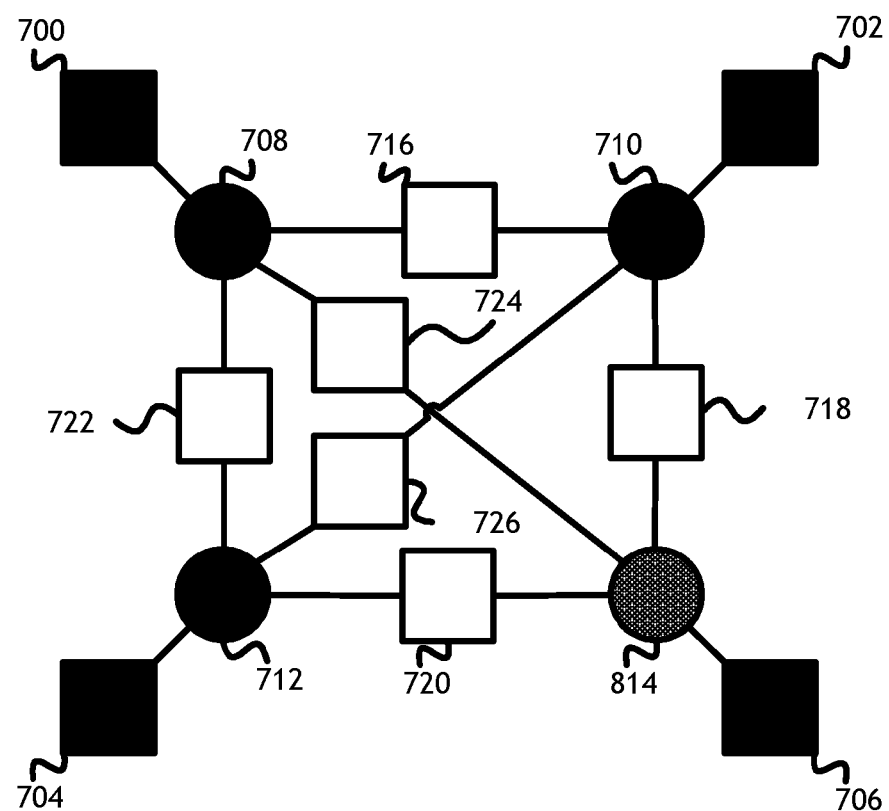
FIG. 8 shows a diagram of a trapping set during a phase of correction according to at least one embodiment of the present invention.

Referring to FIG. 8, a block diagram of a trapping set during a phase of correction according to at least one embodiment of the present invention is shown. Using the methods described herein, a decoder determines that one of the error bit nodes 708, 710, 712, 714, is erroneous as a result of a write error or stuck cell. For example the fourth error bit node 714 is determined to be the result of a write error. The decoder erases the log likelihood ratio associated with the fourth error bit node 714 and classifies it as an erased bit node 814. The decoder then attempts to decode.

Figure 9:
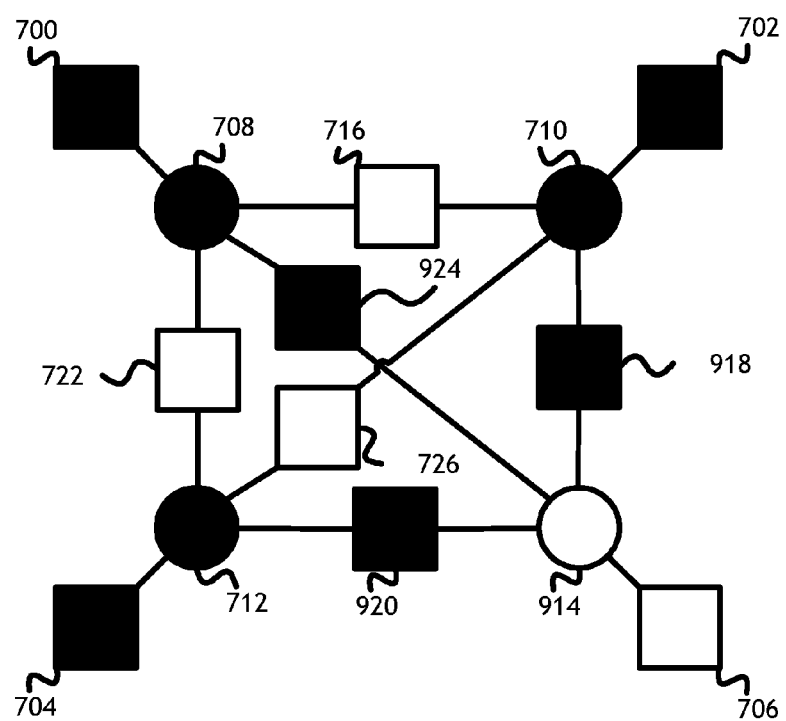
FIG. 9 shows a diagram of a trapping set during a phase of correction according to at least one embodiment of the present invention.

Referring to FIG. 9, a block diagram of a trapping set during a phase of correction according to at least one embodiment of the present invention is shown. A decoder, having erased the fourth bit node 914, successfully decodes the fourth bit node 914 and determines that three of the bit node interconnected check nodes are unsatisfied checks 924, 918, 920 but the previously unsatisfied check node 706 connected to the fourth bit node 914 is now satisfied.

Figure 10:
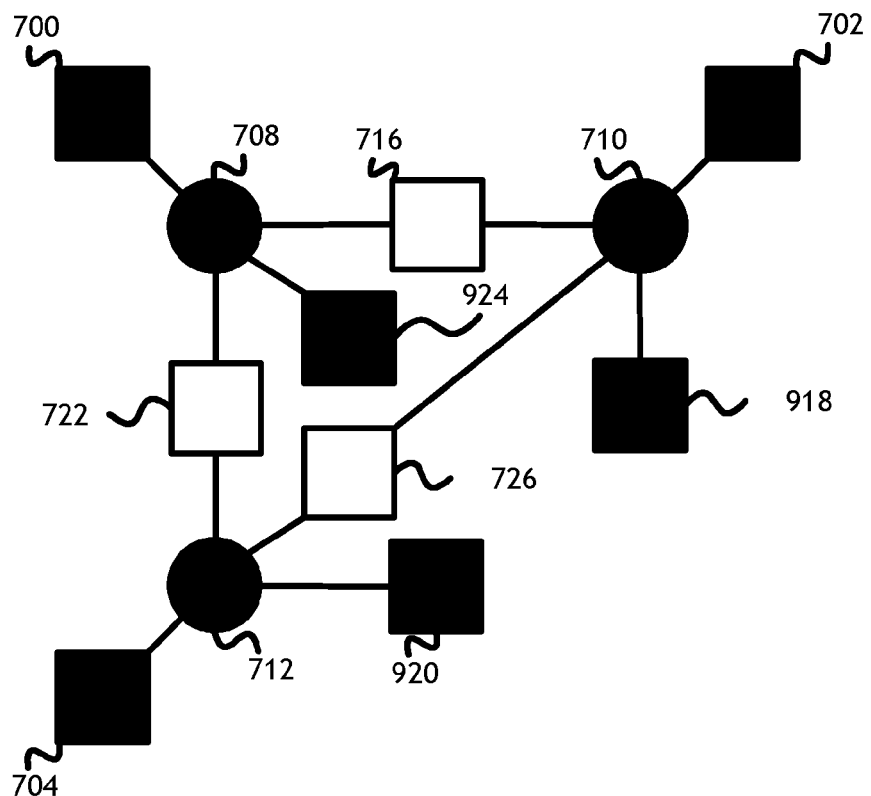
FIG. 10 shows a diagram of a trapping set during a phase of correction according to at least one embodiment of the present invention.

Referring to FIG. 10, a block diagram of a trapping set during a phase of correction according to at least one embodiment of the present invention is shown. Removing the fourth bit node from consideration, a decoder iteratively considers the remaining error bit nodes 708, 710, 712, unsatisfied check nodes 700, 702, 704, 918, 920, 924 and satisfied check nodes 716, 722, 726.

Figure 11:
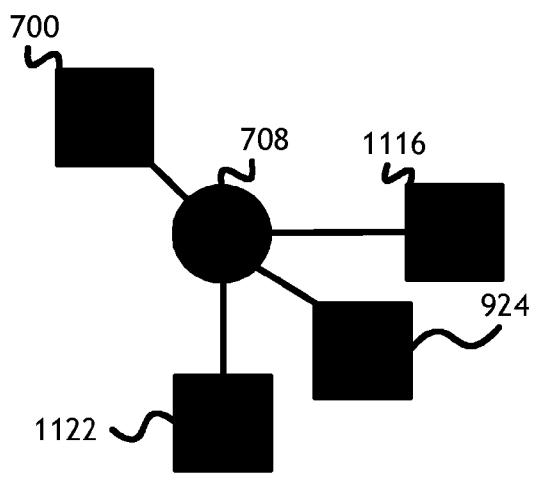
FIG. 11 shows a diagram of a trapping set during a phase of correction according to at least one embodiment of the present invention.

Referring to FIG. 11, a block diagram of a trapping set during a phase of correction according to at least one embodiment of the present invention is shown. Using iterative decoding techniques, a decoder determines that the second and third error bit nodes 710, 712 were erroneous and corrects, resulting in the remaining satisfied check nodes 716, 722 connected to the first error bit node 708 being classified as unsatisfied check nodes 1116, 1122. The decoder corrects the first error bit node 708 and thereby clears the trapping set.

Figure 12:
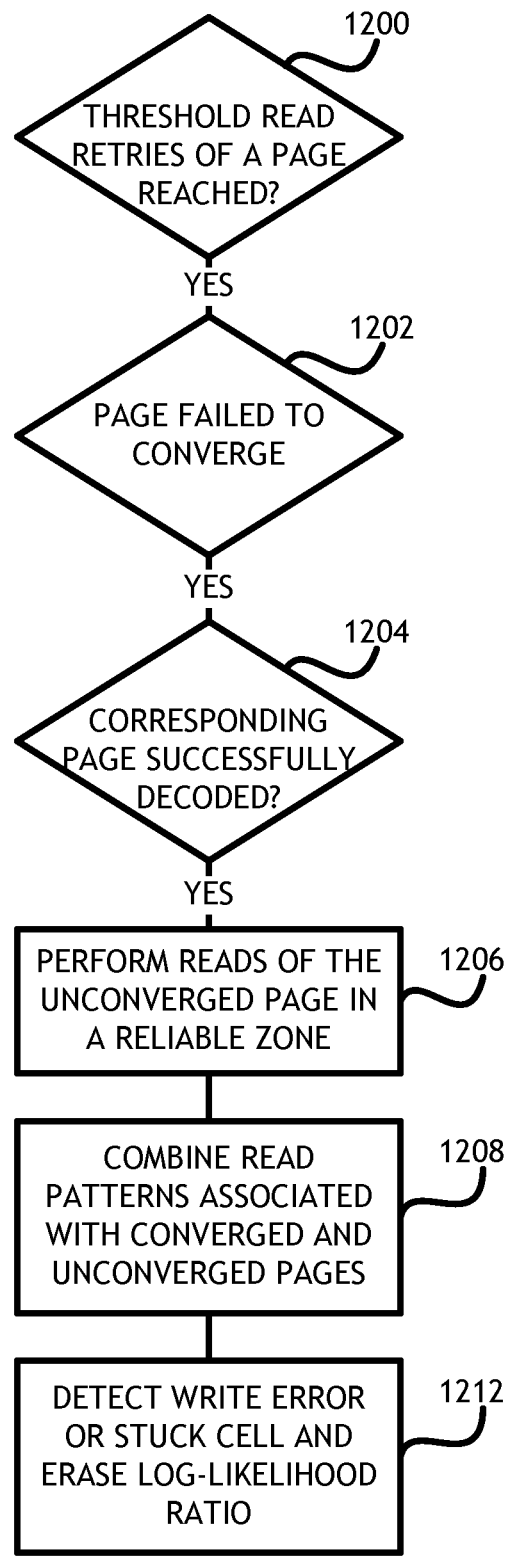
FIG. 12 shows a flowchart of a method for correcting error bits resulting from write errors or stuck cells.

Referring to FIG. 12, a flowchart of a method for correcting error bits resulting from write errors or stuck cells is shown. In at least one embodiment, when decoding a low-density parity-check code utilizing multi-level cells, if a threshold number of read retires of a page is reached 1200 and the page has failed to converge 1202, a decoder attempts to correct a potential write error. In a multi-level cell, a corresponding intra-cell page may have successfully decoded 1204. In that case, the controller performs 1206 two additional reads of the cell in reliable zones associated with the potential states of the non-converged page. The decoder combines 1208 Multi-read patterns of both the decoded and non-converged pages corresponding to a sweep of threshold voltages between potential cell states in reliable zones. The decoder then detects a write error or stuck cell based on the successfully decoded bit and potentially hard decisions associated with the bit, and the combined Multi-read patterns. The decoder then erases the log-likelihood ratio of the write error or stuck cell bit and re-decodes.

It is believed that the present invention and many of its attendant advantages will be understood by the foregoing description of embodiments of the present invention, and it will be apparent that various changes may be made in the form, construction, and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A computer apparatus comprising:
a processor;
a memory connected to the processor; and
computer executable program code embodied in the memory and configured to execute on the processor,
wherein the computer executable program code configures the processor to:
detect voltages in a multi-level memory cell wherein the multi-level memory cell is configured to store at least two bits of a low-density parity-check codeword;
determine that a first bit of the at least two bits correctly decoded;
receive bit page data corresponding to the first bit; and
erase a log-likelihood ratio associated with a second bit in the at least two bits.

2. The computer apparatus of claim 1, wherein the computer executable program code further configures the processor to:
perform a sweep of voltages associated with the multi-level memory cell; and
determine one or more threshold voltages associated with a boundary between cell states of a most significant bit based on the sweep.

3. The computer apparatus of claim 2, wherein the computer executable program code further configures the processor to:
perform a sweep of voltages associated with the multi-level memory cell; and
determine one or more threshold voltages associated with a boundary between cell states of a least significant bit based on the sweep.

4. The computer apparatus of claim 3, wherein the computer executable program code further configures the processor to perform two voltage reads, each corresponding to potential states of the second bit, and each corresponding to a reliable zone.

5. The computer apparatus of claim 3, wherein the second bit is a most significant bit in the multi-level memory cell.

6. The computer apparatus of claim 3, wherein the second bit is a least significant bit in the multi-level memory cell.

7. The computer apparatus of claim 1, wherein the computer executable program code further configures the processor to iteratively decode a low-density parity-check codeword at least partially stored in the multi-level memory cell.

8. A method for correcting errors in a low-density parity-check code comprising:
detecting voltages in a multi-level memory cell wherein the multi-level memory cell is configured to store at least two bits of a low-density parity-check codeword;
determining that a first bit of the at least two bits correctly decoded;
receiving bit page data corresponding to the first bit; and
erasing a log-likelihood ratio associated with a second bit in the at least two bits.

9. The method of claim 8, further comprising:
performing a sweep of voltages associated with the multi-level memory cell; and
determining one or more threshold voltages associated with a boundary between cell states of a most significant bit based on the sweep.

10. The method of claim 9, further comprising:
performing a sweep of voltages associated with the multi-level memory cell; and
determining one or more threshold voltages associated with a boundary between cell states of a least significant bit based on the sweep.

11. The method of claim 10, further comprising performing two voltage reads, each corresponding to potential states of the second bit, and each corresponding to a reliable zone.

12. The method of claim 10, wherein the second bit is a most significant bit in the multi-level memory cell.

13. The method of claim 10, wherein the second bit is a least significant bit in the multi-level memory cell.

14. The method of claim 8, further comprising iteratively decoding a low-density parity-check codeword at least partially stored in the multi-level memory cell.

15. A data storage system comprising:
a processor;
a memory connected to the processor;
a data storage element including a plurality of multi-level memory cells; and
computer executable program code embodied in the memory and configured to execute on the processor, wherein:
each of the plurality of multi-level memory cells is configured to store a most significant bit and a least significant bit represented as four potential voltage values, each corresponding to a cell state;
each of the plurality of multi-level memory cells is configured to store bits of a low-density parity-check codeword; and
the computer executable program code configures the processor to:
detect voltages in a multi-level memory cell in the data storage element;
determine that a first bit of the multi-level memory cell correctly decoded;
receive bit page data corresponding to the first bit; and
erase a log-likelihood ratio associated with a second bit of the multi-level memory cell.

16. The data storage system of claim 15, wherein the computer executable program code further configures the processor to:
perform a sweep of voltages associated with the multi-level memory cell; and
determine one or more threshold voltages associated with a boundary between cell states of the most significant bit based on the sweep.

17. The data storage system of claim 16, wherein the computer executable program code further configures the processor to:
perform a sweep of voltages associated with the multi-level memory cell; and
determine one or more threshold voltages associated with a boundary between cell states of the least significant bit based on the sweep.

18. The data storage system of claim 17, wherein the computer executable program code further configures the processor to perform two voltage reads, each corresponding to potential states of the second bit, and each corresponding to a reliable zone.

19. The data storage system of claim 17, wherein the second bit is the most significant bit in the multi-level memory cell.

20. The data storage system of claim 17, wherein the second bit is the least significant bit in the multi-level memory cell.

* * * * *